US006443641B2

(12) United States Patent
Takamori et al.

(10) Patent No.: US 6,443,641 B2
(45) Date of Patent: Sep. 3, 2002

(54) SUBSTRATE PROCESS METHOD AND SUBSTRATE PROCESS APPARATUS

(75) Inventors: Hideyuki Takamori; Kiyohisa Tateyama; Kengo Mizosaki; Noriyuki Anai; Mitsuhiro Sakai; Shinobu Tanaka; Yoichi Honda; Yuji Shimomura, all of Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/874,259

(22) Filed: Jun. 6, 2001

Related U.S. Application Data

(62) Division of application No. 09/362,860, filed on Jul. 29, 1999, now Pat. No. 6,261,007.

(30) Foreign Application Priority Data

Jul. 29, 1998 (JP) .......................................... 10-228644
Aug. 5, 1998 (JP) .......................................... 10-233599

(51) Int. Cl.[7] ................................................ G03D 5/00
(52) U.S. Cl. .................... 396/579; 396/611; 427/255.6; 118/52; 34/381

(58) Field of Search .................................. 396/611, 579, 396/604; 118/52, 54, 319, 320, 500, 715, 726; 134/2, 4, 157, 902; 427/240, 255.6, 294, 299; 34/381, 407; 216/43

(56) References Cited

U.S. PATENT DOCUMENTS

| 5,641,541 A | 6/1997 | Chen ........................ 427/255.6 |
| 5,670,210 A | 9/1997 | Mandal et al. ................. 118/52 |
| 6,112,430 A | 9/2000 | Park et al. ..................... 34/381 |

FOREIGN PATENT DOCUMENTS

| JP | 63-010528 | 1/1988 |
| JP | 63-302521 | 12/1988 |
| JP | 09-164364 | 6/1997 |
| JP | 11-312659 | 11/1999 |

*Primary Examiner*—D. Rutledge
(74) *Attorney, Agent, or Firm*—Rader, Fishman & Grauer PLLC

(57) ABSTRACT

Just after resist solution is coated on a substrate, it is dried substantially in a non-heating state. In reality, inertia gas or the like is blown from a shower head to the substrate. Thus, the resist solution coated on the substrate is dried. Consequently, transfer marks that cause the film thickness of resist film to be unequal and the line width of a circuit pattern to fluctuate can be prevented.

7 Claims, 9 Drawing Sheets

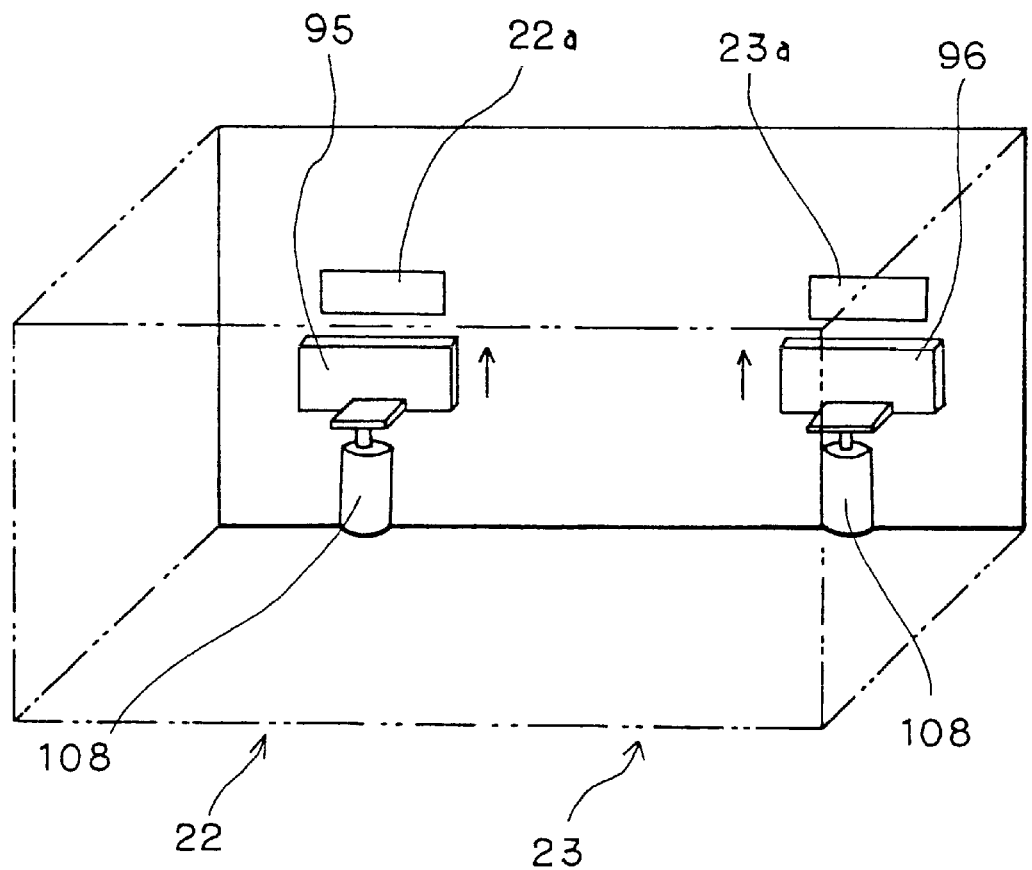
F I G. 4

SUBSTRATE PROCESS METHOD AND SUBSTRATE PROCESS APPARATUS

This application is a divisional application of U.S. Ser. No. 09/362,860 filed on Jul. 29, 1999, now U.S. Pat. No. 6,261,007.

BACKGROUND OF THE INVENTION

1. Field of the Invention

The present invention relates to a substrate process method and a substrate process apparatus for heating and drying resist solution on a substrate such as an LCD substrate to be ID processed before an exposing process and a developing process are performed.

2. Description of the Related Art

When a liquid crystal display (LCD) is fabricated, photoresist solution is coated on a rectangular glass LCD substrate so as to form a resist film. The resist film is exposed corresponding to a circuit pattern. Thereafter, the exposed resist film is developed. Thus, a circuit pattern is formed by photolithography technology.

Before the resist coating process is performed, a hydrophobic process (HMDS process) is performed a rectangular LCD substrate (hereinafter referred to as substrate) in an adhesion process unit so as to improve the adhesiveness of the resist. Thereafter, the substrate is cooled by a cooling unit. The resultant substrate is loaded to a resist coating process unit.

In the resist coating process unit, while the rectangular substrate held on a spin chuck is being rotated, resist solution is sprayed to the center of the front surface of the substrate. The resist solution spreads out on the front surface of the substrate due to centrifugal force of the rotation of the substrate. Thus, the resist film is equally coated on all the front surface of the substrate.

Excessive resist on the periphery of the substrate is removed. The resultant substrate is loaded to a heating process unit. In the heating process unit, a pre-baking process is preformed. In the heating process unit, the substrate is transferred through lift pins and placed on fixed pins of a heating plate and the substrate is heated with heat radiation of the heating plate so as to prevent the substrate from directly contacting the heating plate. This heating method is referred to as proximity method.

Thereafter, the substrate is cooled by a cooling unit. The resultant substrate is conveyed to an exposing unit. In the exposing unit, a predetermined pattern is exposed on the substrate. Thereafter, a developing process and a post-baking process are performed. Thus, a predetermined resist pattern is formed.

However, in the above-described coating and developing processes, after a substrate coated with resist solution is pre-baked or a substrate is exposed and developed, marks of lift pins, fixed pins, vacuum groove, or the like may be transferred to the substrate.

After the pre-baking process is performed, since the film thickness of resist solution coated on the substrate varies corresponding to the marks of the lift pins or the like, the marks of lift pins or the like are transferred. After the exposing and developing processes are performed, since the line width of a circuit pattern formed on the substrate varies corresponding to the marks of the lift pins or the like, the marks of the lift pins or the like are transferred. After the pre-baking process is performed, marks of lift pins or the like may not be present. However, after the developing process is performed, marks of lift pins or the like may be present.

As causes of transfer marks, it is estimated that high sensitivity resist solution has been used in recent years and that the line width of a circuit pattern formed on an LCD substrate is as small as 3 :m. However, the causes have not been proved. Thus, technologies for preventing such transfer marks from taking place on a substrate have not been accomplished.

Phenomena of transfer marks show that the film thickness of resist solution coated on a substrate varies corresponding to heat radiation from support pins and proximity pins. After the exposing and developing processes are performed, the line width of a circuit pattern formed on a substrate varies corresponding to heat radiation from support pins and proximity pins. This is because the temperature of support pins and proximity pins is higher than the temperatures of the other portions of the LCD substrate. In contrast, the temperature of the vacuum groove is lower than the temperatures of the other portions of the LCD substrate. Since transfer marks are present on products, product defects take place.

However, as described above, since transfer marks of lift pins or the like take place due to unevenness of film thickness of a resist film and fluctuation of line width of a circuit pattern, it is necessary to prevent such transfer marks from taking place on an LCD substrate in the coating and developing processes. Moreover, in high sensitivity resist that will be widely used, when resist is not completely dried after the resist coating process is performed until the exposing process is performed, the resist that has not been dried dissolves in developing solution. Thus, the line width of the circuit pattern will vary.

SUMMARY OF THE INVENTION

The present invention is made from the above-described point of view. An object of the present invention is to provide a substrate process method and a substrate process apparatus for preventing transfer marks due to unevenness of a film thickness of resist solution and fluctuation of a line width of a circuit pattern from taking place. Another object of the present invention is to provide a substrate process method and a substrate process apparatus for more securely drying resist solution coated on a substrate free from transfer marks.

A first aspect of the present invention is a substrate process method for heating and drying resist solution coated on a substrate to be processed before an exposing process and a developing process are performed, comprising the steps of coating resist solution on a substrate, drying the substrate substantially in non-heating state, and heating and drying the substrate.

A second aspect of the present invention is a substrate process method for forming a particular film on the front surface of a substrate, comprising the steps of coating solution on the front surface of a substrate and drying the substrate in atmosphere at first reduced pressure, and drying the substrate in atmosphere at second reduced pressure in non-heating state, the second reduced pressure being lower than the first reduced pressure.

When a drying process is performed in a non-heating state, gas is blown to the substrate coated with the resist solution.

According to the present invention, just after resist solution is coated on a substrate, it is dried substantially in a non-heating state. Thus, solvent in resist solution gradually evaporates. Consequently, the resist can be acceleratingly dried without affecting it. As a result, transfer marks can be effectively prevented from taking place on the substrate.

In the first drying process, the pressure of the atmosphere in the process chamber is reduced from the normal pressure in such a manner that small foams in the resist film do not grow. Thereafter, in the second drying process, the resist film is dried in the atmosphere whose pressure is lower than the atmosphere in the first drying process. Thus, since small forms do not grow in the resist film, the film thickness of the resist film do not vary. Consequently, transfer marks can be effectively prevented. As a drying process in a non-heating state, gas is blown to a substrate coated with resist solution. Alternatively, when the pressure of atmosphere of a substrate coated with resist solution is reduced, the substrate can be dried with a simple means in a non-heating state.

After the drying process is performed in the non-heating state, when resist on edge surfaces of the substrate is removed, since the resist solution is dried, excessive resist solution can be easily removed.

These and other objects, features and advantages of the present invention will become more apparent in light of the following detailed description of a best mode embodiment thereof, as illustrated in the accompanying drawings.

BRIEF DESCRIPTION OF THE DRAWING

FIG. 4 is a perspective view showing the structure of substrate loading/unloading openings and shutters of the resist coating process unit (CT) and the drying process unit (DR);

DESCRIPTION OF THE PREFERRED EMBODIMENTS

Next, a preferred embodiment of the present invention will be described. A preferred embodiment of the present invention is an apparatus for use with a resist process system that forms photoresist on the front surface of a glass substrate G for a liquid crystal display (LCD) (hereinafter, the glass substrate G is abbreviated as substrate G). It should be noted that the present invention can be applied to a plate shaped substrate such as a semiconductor wafer rather than the substrate G.

Figure 1:
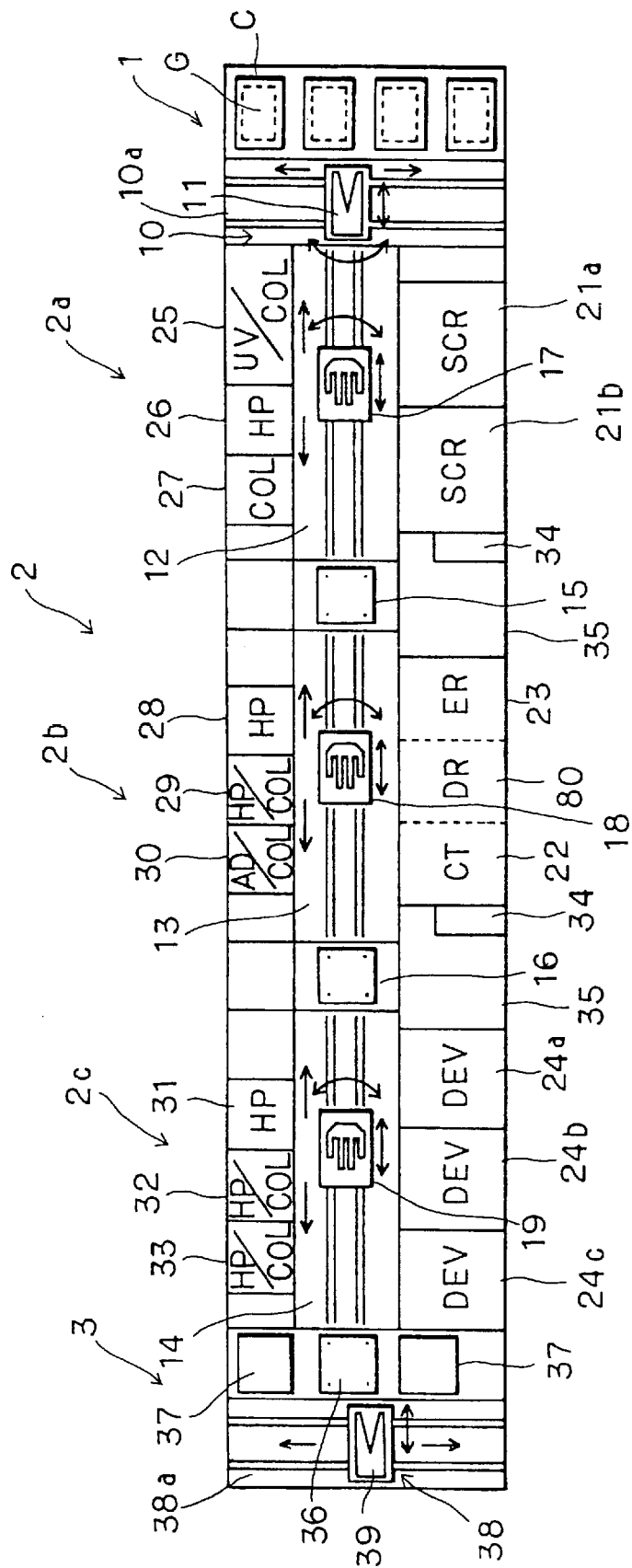
FIG. 1 is a plan view showing the structure of an LCD substrate coating/developing process system according to the present invention.

FIG. 1 is a plan view showing the structure of an LCD substrate coating/developing process system as an example of a substrate process apparatus according to the present invention.

The coating/developing process system comprises a cassette station 1, a process portion 2, and an interface portion 3. The cassette station 1 holds cassettes C. Each cassette accommodates a plurality of substrates G. The process portion 2 has a plurality of process units that perform a sequence of processes such as a resist coating process and a developing process for substrates G. The interface portion 3 exchanges a substrate G with an exposing unit (not shown). The cassette station 1 and the interface 3 are disposed on both ends of the process portion 2.

The cassette station 1 has a conveying mechanism 10 that conveys a substrate G between a cassette C and the process portion 2. The cassette station 1 loads and unloads a cassette C. The conveying portion 10 has a conveying mechanism 11 that travels along a conveying path 10a disposed along the cassettes C. The conveying mechanism 11 conveys a substrate G between a cassette C and the process portion 2.

The process portion 2 is composed of a front stage portion 2a, a middle stage portion 2b, and a rear stage portion 2c. Conveying paths 12, 13, and 14 are disposed at the center portions of the front stage portion 2a, the middle stage portion 2b, and the rear stage portion 2c, respectively. Individual process units are disposed on both sides of the conveying paths 12, 13, and 14.

The front stage portion 2a has for example a main conveying unit 17 as an external conveying mechanism that travels along the conveying path 12. The main conveying unit 17 conveys a substrate G to the outside of the front stage portion 2a. Two cleaning units (SCR) 21a and 21b are disposed on one side of the conveying path 12. An ultraviolet ray radiating/cooling unit (UV/COL) 25, a heating process unit (HP) 26, and a cooling unit (COL) 27 are disposed on the other side of the conveying path 12. Each of the heating process unit (HP) 26 and the cooling unit (COL) 27 are composed of an upper unit and a lower unit.

The middle stage portion 2b has a main conveying unit 18 that travels along the conveying path 13. For example, a resist coating process unit (CT) 22 as a coating process portion, a drying process unit (DR) 80, and an edge remover (ER) 23 as a removing process portion that removes resist on the periphery of a substrate G are integrally disposed as a unit portion 107 on one side of the conveying path 13. A heating process unit (HP) 28, a heating process/cooling unit (HP/COL) 29, and an adhesion process/cooling unit (AD/COL) 30 are disposed on the other side of the conveying path 13. The heating process unit (HP) 28 is composed of a plurality of heat process portions as an upper unit and a lower unit. The heating process/cooling unit (HP/COL) 29 is composed of a heating process unit and a cooling unit disposed as an upper unit and a lower unit, respectively. The adhesion process/cooling unit (AD/COL) 30 is composed of an adhesion process unit and a cooling unit as an upper unit and a lower unit, respectively.

Since the drying process unit (DR) 80 is disposed between the resist coating process unit (COT) 22 and the edge remover (ER) 23, a substrate G coated with resist solution is conveyed to the drying process unit (DR) 80. The drying process unit (DR) 80 drys the substrate G. Thereafter, the edge remover (ER) 23 performs an edge surface process for the substrate G.

The rear stage portion 2c has a main conveying unit 19 that travels along the conveying path 14. Three developing process units 24a, 24b, and 24c are disposed on one side of the conveying path 14. A heating process unit 31 and two heating process/cooling units (HP/COL) 32 and 33 are disposed on the other side of the conveying path 14. The heating process unit 31 is composed of an upper unit and a lower unit. Each of the heating process/cooling units (HP/

COL) 32 and 33 is composed of a heating process unit and a cooling unit as an upper unit and a lower unit.

In the process portion 2, only spinner type units such as the cleaning process unit 21a, the resist process unit 22, and the developing process unit 24a are disposed on one side of the conveying paths. Only heat process units such as the heating process unit and the cooling units are disposed on the other side of the conveying paths.

Chemical supplying units 13 are disposed on the spinner type unit side of relaying portions 15 and 16. Loading/unloading space portions 35 are disposed next to the chemical supplying units 34.

The main conveying unit 17 exchanges a substrate G with an arm 11 of the conveying mechanism 10, loads/unloads the substrate G to/from each process unit of the front stage portion 2a, and exchanges the substrate G with the relaying portion 15. The main conveying unit 18 exchanges a substrate G with the relaying portion 15, loads/unloads the substrate G to/from each process unit of the middle stage portion 2b, and exchanges the substrate G with the relaying portion 16. The main conveying unit 19 exchanges a substrate G with the relaying portion 16, loads/unloads the substrate G to/from each process unit of the rear stage portion 2c, and exchanges the substrate G with the interface portion 3. The relaying portions 15 and 16 also function as cooling plates.

The interface portion 3 comprises an extension 36, two buffer stages 37, and a conveying mechanism 38. The extension 36 temporally holds a substrate exchanged with the process portion 2. The two buffer stages 37 are disposed on both sides of the extension 36. The two buffer stages 37 hold buffer cassettes. The conveying mechanism 38 exchanges a substrate G with the exposing unit (not shown). The conveying mechanism 38 has a conveying arm 39 that travels on a conveying path 38a disposed along the extension 36 and the buffer stages 37. The conveying arm 39 conveys a substrate G between the process portion 2 and the exposing unit.

When these process units are integrally disposed, the installation space of the system is reduced and the efficiencies of the processes are improved.

The outside of each unit is covered with an outer plate so as to maintain atmosphere of each unit. In addition, the resist coating process unit (CT) 22, the drying process unit (DR) 80, and the edge remover (ER) 23 that are integrally disposed are isolated from other units with partition plates so as to maintain atmosphere of these units against atmosphere of the other units.

Figure 2:
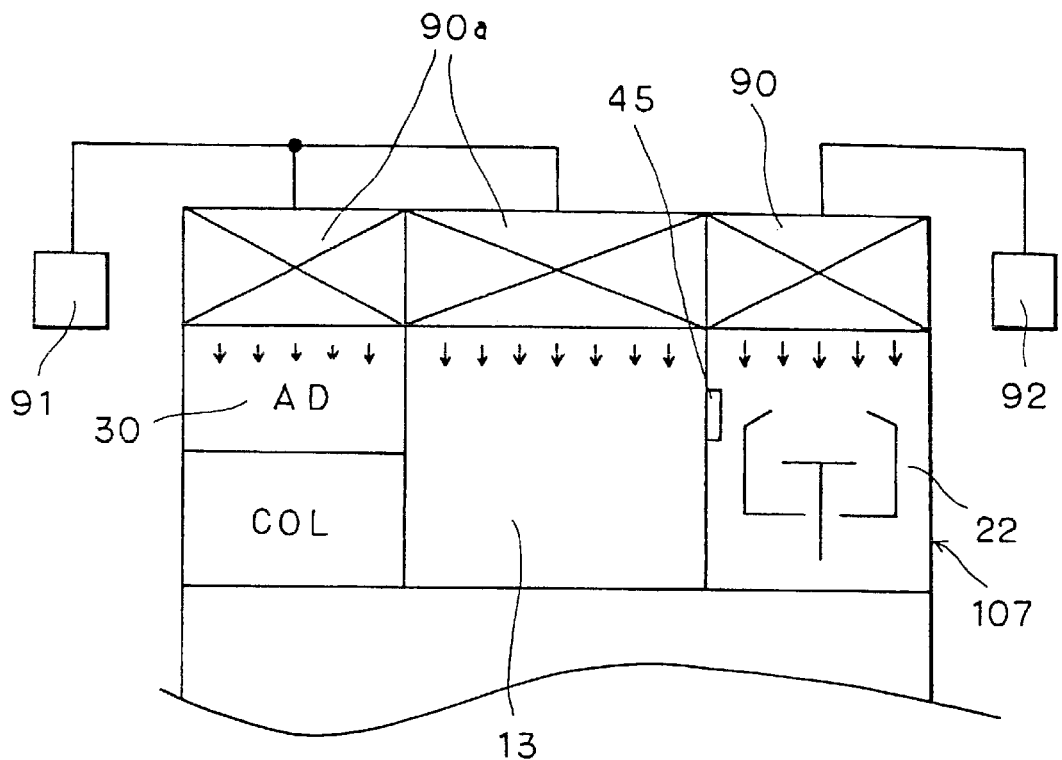
FIG. 2 is a sectional view showing the LCD substrate coating/developing process system.

As shown in FIG. 2, atmosphere controlling mechanisms such as fan filter units 90 and 90a that control inner atmosphere of temperature, humidity, contamination particles, chemical, and so forth in the unit portion 107 and the other portion are disposed above the upper portion of the system. The fan filter units 90 and 90a downwardly blow atmosphere to the individual units.

In the coating/developing process system with the above-described structure, a substrate G in a cassette C is conveyed to the process portion 2. In the front stage portion 2a of the process portion 2, the ultraviolet ray radiating/cooling unit (UV/COL) 25 performs a surface reforming process, a cleaning process, and a cooling process for the substrate G. Thereafter, the cleaning process units (SCR) 21a and 21b perform a scrubber cleaning process for the substrate G. One of the upper and lower units of the heating process unit (HP) 26 heats and drys the substrate G. One of the upper and lower units of the cooling unit (COL) 27 cools the substrate G.

Thereafter, the substrate G is conveyed to the middle stage portion 2b. In the middle stage portion 2b, the adhesion process unit (AD) as the upper unit of the adhesion process/cooling unit (AD/COL) 30 performs a hydrophobic process (HMDS) for the substrate G. The cooling unit (COL) cools the substrate G. The resist coating process unit (CT) 22 coats resist on the substrate G. As will be described later, the drying process unit (DR) 80 drys the substrate G. The edge remover (ER) 23 removes excessive resist of the periphery of the substrate G. Thereafter, one of the upper and lower units of the heating process unit (HP) of the middle stage portion 2b pre-bakes the substrate G. The cooling unit as the lower unit of the heating process/cooling unit (HP/COL) 29 or 30 cools the substrate G.

Thereafter, the main conveying unit 19 conveys the substrate G from the relaying portion 16 to the exposing unit through the interface portion 3. The exposing unit exposes a predetermined pattern of the substrate G. The resultant substrate G is loaded to one of the developing process units (DEV) 24a, 24b, and 24c through the interface portion 3. The developing process unit (DEV) forms a predetermined circuit pattern on the substrate G. One of the heating process units (HP) of the rear stage portion 2c post-bakes the substrate G. The cooling unit (COL) cools the substrate G. The resultant substrate G is placed in a predetermined cassette on the cassette station 1 by the main conveying units 19, 19, 17, and the conveying mechanism 10.

Figure 3:
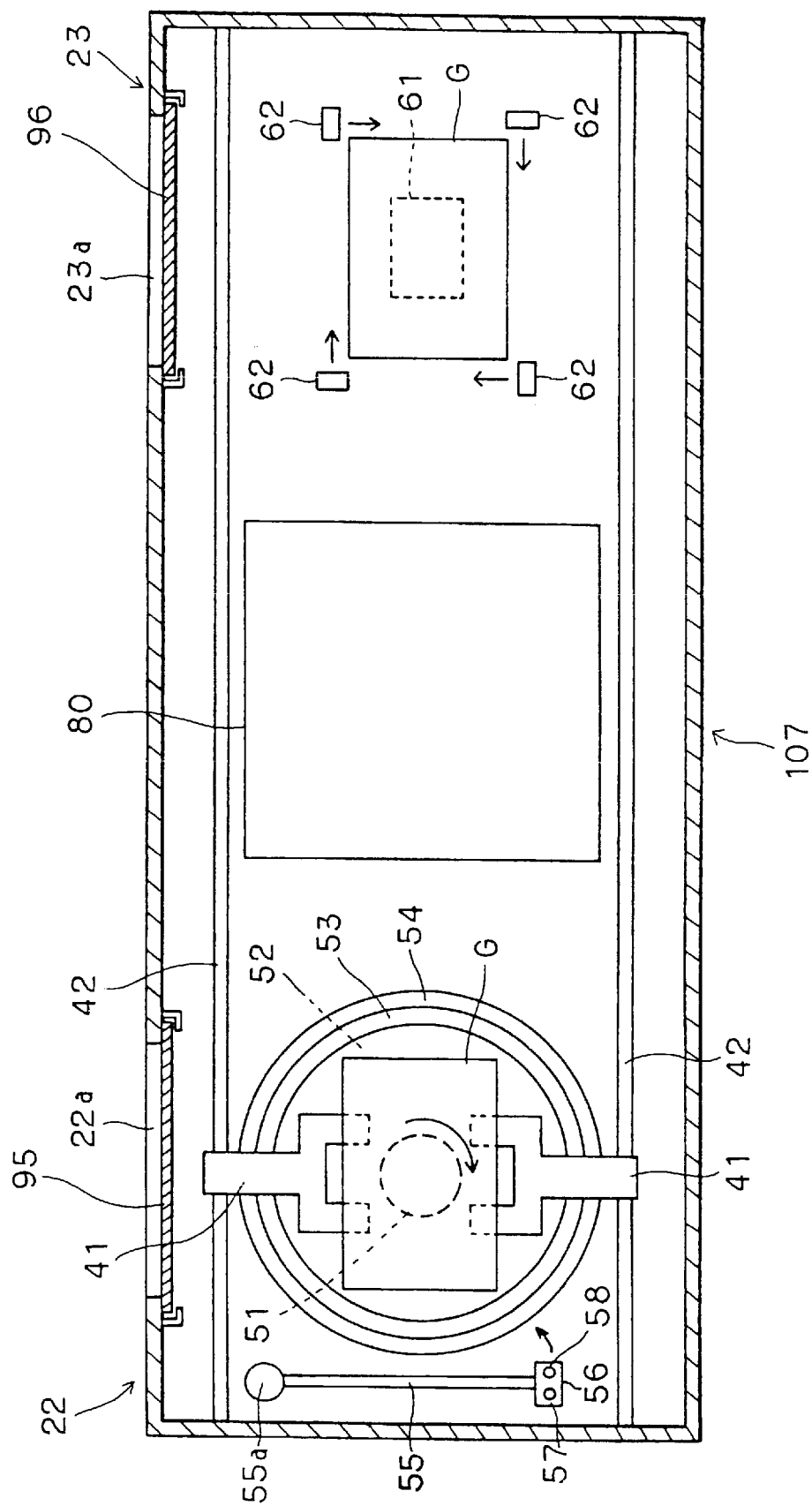
FIG. 3 is a plan view showing the overall structure of a resist coating process unit (CT), a drying process unit (DR), and an edge remover (ER) that are integrally disposed.

Next, the resist coating process unit (COT) 22, the drying process unit (DR) 80, and the edge remover (ER) 23 integrally disposed in the coating/developing process system according to the embodiment of the present invention will be described. FIG. 3 is a plan view showing the overall structure of the resist coating process unit (CT), the drying process unit (DR), and the edge remover (ER) that are integrally disposed.

As shown in FIG. 3, the unit portion 107 composed of the resist coating process unit (COT) 22, the drying process unit (DR) 80, and the edge remover (ER) 23 is integrally disposed on the same stage. The resist coating process unit (COT) 22 coats resist on a substrate G. The conveying arm 41 that is an intra-unit conveying mechanism that travels along a pair of guide rails conveys the substrate G to the edge remover (ER) 23 through the drying process unit (DR) 80. As shown in FIG. 4, a loading opening 22a to which the main conveying unit 18 loads a substrate G is disposed on the conveying path side of the resist coating process unit (COT) 22. An unloading opening 23a from which the main conveying unit 18 unloads a substrate G is formed on the conveying path side of the edge remover (ER) 13. Shutters 95 and 96 and shutter driving mechanisms 108 thereof are disposed at the loading opening 22a and the unloading opening 23a in the resist coating process unit (COT) 22 and the edge remover (ER) 23, respectively. The shutters 95 and 96 are driven by the respective shutter driving mechanisms 108. The moving portions of the shutter driving mechanisms 108 are disposed at the same positions or lower positions of the substrate holding positions of the resist coating process unit (COT) 22 and the edge remover (ER) 23 so as to prevent particles of the moving portions of the shutter driving mechanisms from adhering to the substrate G.

Figure 5:
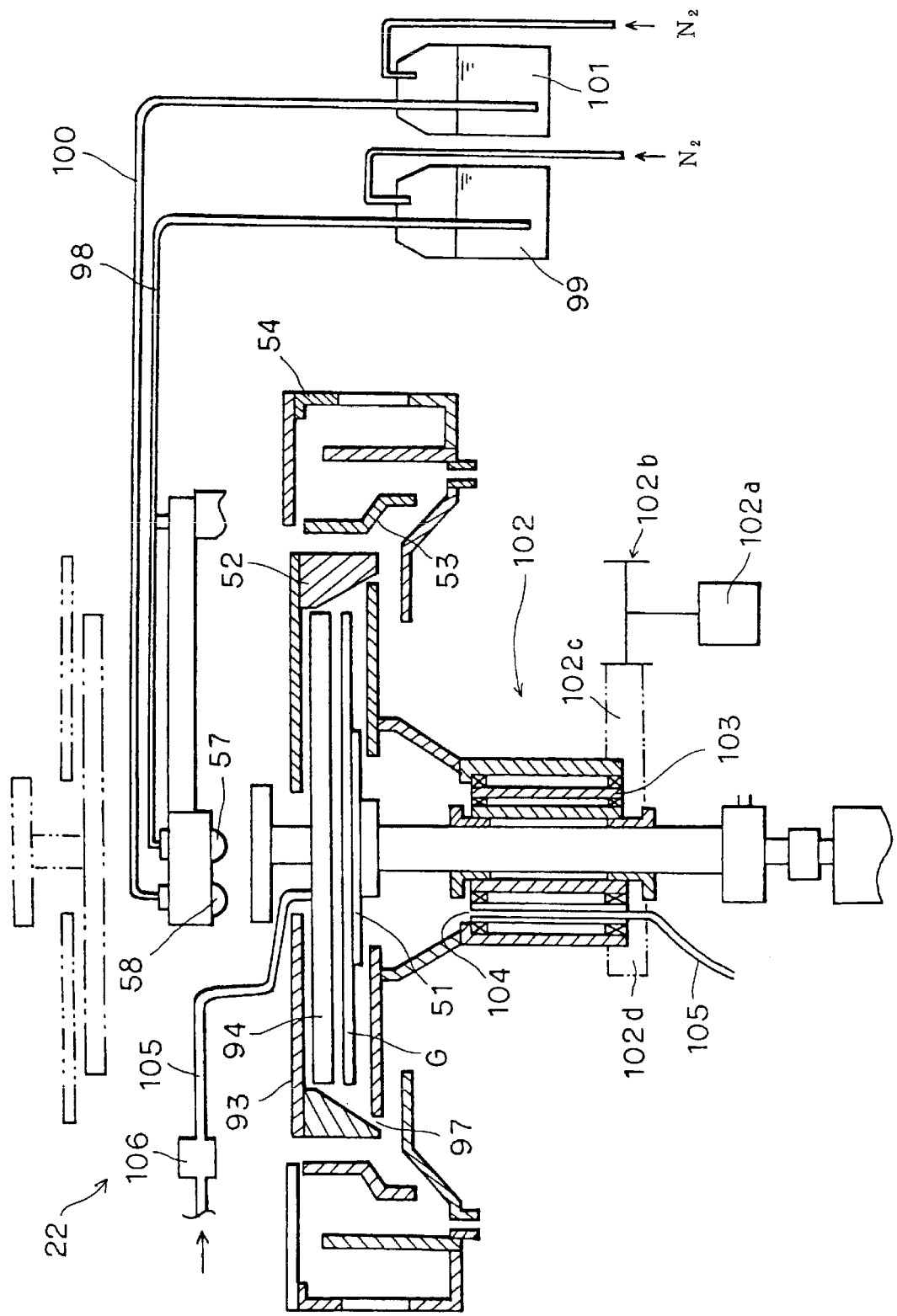
FIG. 5 is a sectional view showing the structure of the resist coating process unit (CT)

FIG. 5 is a sectional view showing the structure of the resist coating process unit (COT) 22. The resist coating process unit (COT) 22 comprises a spin chuck 51, a rotating cup 52, a cover 93, a shower head 94, a pipe 105, a valve 106, a coater cup 53, and a drain cup 54. The spin chuck 51 horizontally rotates, sucks and holds a substrate G. The rotating cup 52 is formed in a top-open cylindrical shape.

The rotating cup 52 surrounds an upper edge portion of the spin chuck 51 and the substrate G sucked by the spin chuck 51. The cover 93 closes the upper opening of the rotating cup 52. The shower head 94 is an air supplying mechanism that is disposed in the rotating cup 52 and that downwardly sprays gas (for example, inertia gas or clean gas) to the substrate G. The pipe 105 supplies gas to the shower head 94. The valve 106 is disposed in the middle of the pipe 105. The valve 106 controls the flow rate of gas. The coater cup 53 fixedly surrounds the outer periphery of the rotating cup 52 so as to prevent resist from splashing in the resist coating process. The drain cup 54 is formed in a hollow ring shape so as to surround the coater cup 53. When resist is sprayed, the cover is removed from the rotating cup 52. At the point, the rotating mechanism 102 rotates the substrate G at low speed along with the spin chuck 51 and the rotating cup 52. When resist is spread out, a cover (not shown) is placed on the rotating cup 52. A rotating mechanism (not shown) rotates the substrate G at high speed along with the spin chuck 51 and the rotating cup 52. A plurality of holes 97 are formed on a lower periphery of the rotating cup 52. When the rotating cup 52 is rotated, atmosphere in the rotating cup 52 is exhausted from the holes 97 due to centrifugal force and thereby the pressure in the rotating cup 52 is reduced. A vacuum exhaust opening 104 is disposed at a fixed member 103 in the driving mechanism 102 connected to the inside of the rotating cup 52. The pipe 105 connected to the exhaust opening 104 is connected to a vacuum pump (not shown) so as to reduce the pressure in the rotating cup 52.

The resist coating process unit (COT) 22 has an arm 55 having a spray head 56 that sprays resist solution and solvent to the substrate G. The arm 55 is rotated around a shaft 55a. When the resist is coated to the substrate G, the spray head 56 is placed above the substrate G sucked by the spin chuck 51. As shown in FIG. 5, when the substrate G is conveyed, the spray head 56 is placed at a standby position outside the drain cup 54. The spray head 56 has a resist nozzle 57 and a solvent nozzle 58. The resist nozzle 57 sprays resist solution. The solvent nozzle 58 sprays solvent such as thinner. The resist nozzle 57 is connected to a resist supplying portion 99 through a resist supplying pipe 98. The solvent nozzle 58 is connected to a solvent supplying portion 101 through a solvent supplying pipe 100.

The edge remover (ER) 23 has a holding table 61. A substrate G is placed on the holding table 61. Four remover heads 62 are disposed adjacent to the four sides of the substrate G. The four remover heads 62 remove excessive resist solution from the four side edges of the substrate G. Each of the remover heads 62 is formed almost in a U-letter shape and sprays thinner. Traveling mechanisms (not shown) travel the remover heads 62 along the four sides of the substrate G. Thus, while the remover heads 62 are traveling along the four sides of the substrate G, they spray thinner to the four side edges of the substrate G so as to remove excessive resist therefrom.

Figure 6:
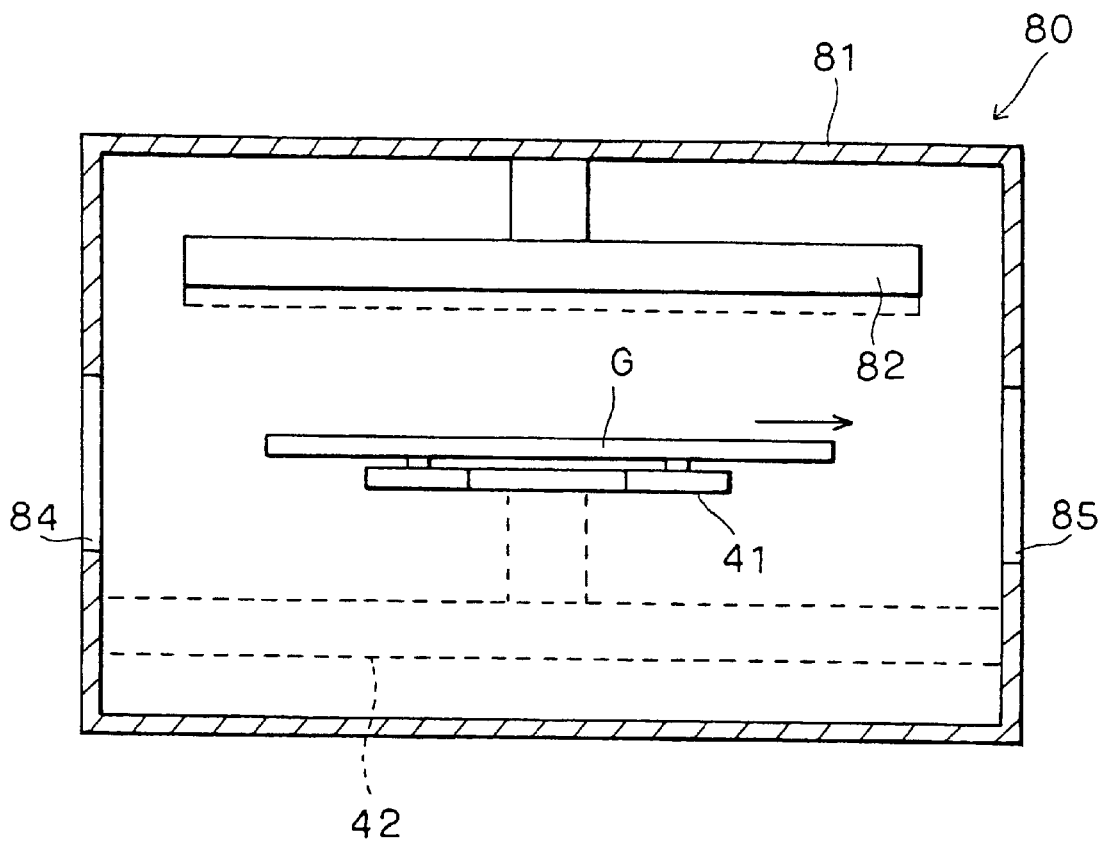
FIG. 6 is a sectional view showing the structure of a drying process unit.

As shown in FIG. 6, the shower head 82 is disposed above a housing 81. The drying process unit (DR) 80 has a shower head 82 (gas spraying means) that sprays gas such as inertia gas. Inertia gas or the like is blown from all the lower surface of the shower head 82.

A substrate loading opening 84 and a substrate unloading opening 85 are disposed at the front and rear of the housing 81. A cut-out portion (not shown) that allows the conveying arm 41 to access the drying process unit (DR) 80 is disposed on a side wall of the housing 81. The conveying arm 41 conveys a substrate G from the loading opening 84 to the inside of the drying process unit (DR) 80. While the conveying arm 41 is unloading the substrate G through the unloading opening 85, the shower head 82 sprays inertia gas or the like to the substrate G.

While the substrate G is being traveled, since inertia gas or the like is blown to the substrate G, resist solution coated on the substrate G is acceleratingly dried. Thus, part of solvent such as thinner or the like in the resist solution evaporates.

Figure 7:
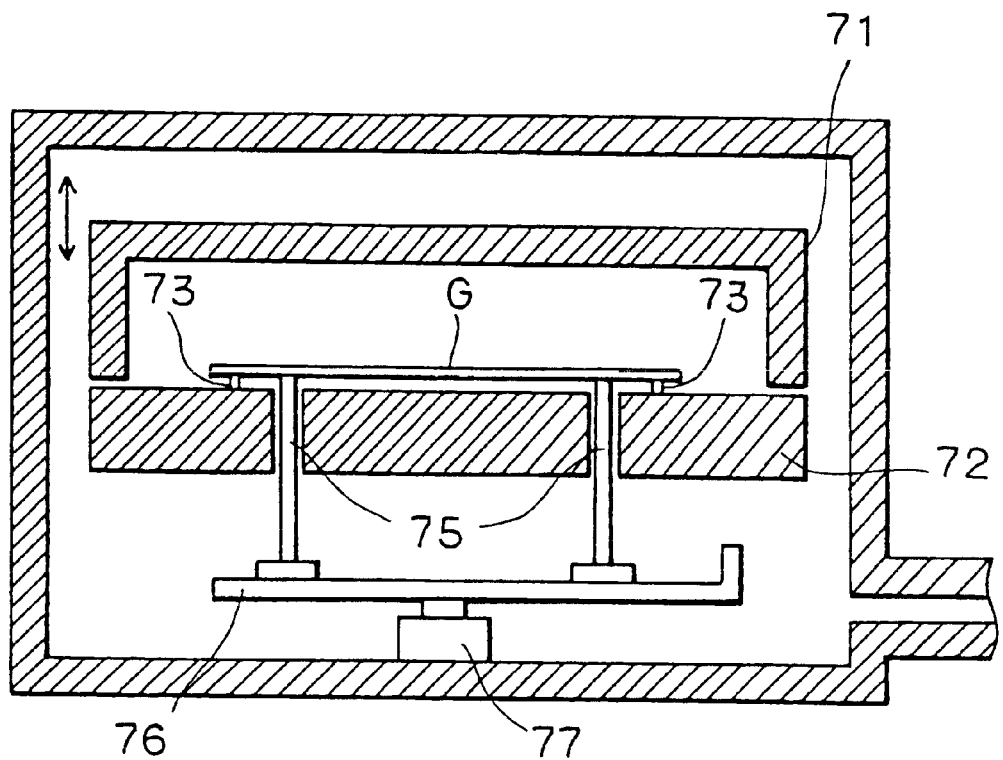
FIG. 7 is a sectional view showing the structure of a heating process unit (HP)

Next, with reference to FIG. 7, the structure of the heating process unit (HP) will be described. FIG. 7 is a sectional view showing the structure of the heating process unit (HP). As shown in FIG. 7, the heating process unit (HP) (28, 29) has a cover 71 that can be raised and lowered. A heating plate 72 is disposed below the cover 71 in such a manner that the front surface of the heating plate 72 is horizontally placed. The heating plate 72 has a heater (not shown) that allows the heating plate 72 to be heated at a desired temperature.

A plurality of fixed pins 73 are disposed on the front surface of the heating plate 72. The fixed pins 73 hold the substrate G. This method is referred to as proximity method. In the proximity method, the fixed pins 73 prevent the heating plate 72 from directly contacting the substrate G. The substrate G is heated with heat radiation of the heating plate 72. Thus, the substrate G can be prevented from being contaminated with the heating plate 72.

The heating plate 72 has a plurality of holes. Lift pins 75 are disposed in the holes of the heating plate 72 in such a manner that the lift pins 75 can be raised and lowered. The lower portions of the lift pins 75 are supported by a support member 76. The support member 76 is raised and lowered by a raising/lowering mechanism 77. When the support member 76 is raised by the raising/lowering mechanism 77, the lift pins 75 are raised and the loaded substrate G is held. Thereafter, the lift pins 75 are lowered and the substrate G is placed on the fixed pins 73. After the heating process is completed, the lift pins 75 are raised and the substrate G is raised to the unloading position.

Next, a sequence of processes from the resist coating process to the heating process will be described in detail.

In the resist coating process unit (COT) 22, the drying process unit (DR) 80, and the edge remover (ER) 23 that are integrally disposed, the shutter 95 of the resist coating process unit (COT) 22 is lowered. The main conveying unit 18 places a substrate G on the spin chuck 51 through the loading opening 22a. After the main conveying unit 18 is exited through the loading opening 22a, the shutter 95 is raised. Thus, the unit portion 107 composed of the resist coating process unit (COT) 22, the drying process unit (DR) 80, and the edge remover (ER) 23 is closed. The substrate G is rotated along with the spin chuck 51 and the rotating cup 52. The arm 55 is rotated so that the spray head 56 is placed above the center of the substrate G. The solvent nozzle 58 sprays thinner to the center of the front surface of the substrate G.

While the substrate G is being rotated, the resist nozzle 57 sprays resist to the center of the front surface of the substrate G so as to spread out the resist ont eh entire front surface of the substrate G. The rotating cup 52 is closed with the cover 93. The rotating speed of the substrate G is increased so as to smooth the film thickness of the resist film.

Thereafter, the rotating cup 52 is rotated or gas is exhausted from the exhaust opening 104. While the inner pressure of the rotating cup 52 is being maintained at a lower pressure than the normal pressure, the resist film is dried (at first drying process).

The inner pressure of the rotating cup 52 is reduced so as to dry the resist film. Thus, since resist does not adhere to the conveying arm 41, particles thereof do not adhere to the substrate G. Consequently, the film thickness of the resist film does not vary with inertia force due to acceleration/ deceleration of the conveying arm 41. Thus, transfer marks can be effectively prevented. In addition, since the inner pressure of the rotating cup 52 is reduced, mist in the rotating cup 52 does not leak. Consequently, particles can be prevented from adhering to the substrate G.

Alternatively, in the first drying process, the substrate G may be heated in such a manner that transfer marks do not take place. In this case, the time period for the drying process can be shortened.

Thereafter, when inertia gas is supplied from the shower head 94 in the rotating cup 52 to the substrate G in such a manner that the film thickness of the resist film does not vary, the time period for the drying process can be further shortened.

The conveying arm 41 conveys the substrate G coated with resist from the spin chuck 51 to the drying process unit (DR) 80. While the substrate G is being conveyed to the drying process unit (DR) 80, the shower head 82 sprays inertia gas to the substrate G. Thus, part of solvent such as thinner in the resist solution evaporates. Thereafter, the resultant substrate G is conveyed to the edge remover (ER) 23. In the edge remover (ER) 23, the substrate G is placed on the holding table 61. The four remover heads 62 travel along the four sides of the substrate G and remove excessive resist on the four side edges of the substrate G with the sprayed thinner. This process is referred to as edge surface process. After the substrate G is unloaded from the edge remover (ER) 23, one of the heating process units (HP) 28 and 29 pre-bakes the substrate G.

Thus, after non-heat drying process is performed, since the heating and drying processes are performed, solvent in resist solution can be completely dried. Consequently, resist solution coated on the substrate G can be prevented from dissolving in developing solution. Thus, since the film thickness of the resist film does not decrease, transfer marks can be effectively prevented.

When temperature and humidity of atmosphere of the unit portion 107 composed of the resist coating process unit (CT) 22, the drying process unit (DR) 80, and the edge remover (ER) 23 vary, the film thickness of resist varies. When there are many contamination particles in the atmosphere of the unit portion 107, they adhere to a non-dried resist film. The contamination particles cannot be removed from atmosphere in the unit portion 107 with down-flow gas. When the concentration of ammonium or the like in atmosphere is high, it reacts with resist. Thus, the resist film deteriorates. To prevent such problems, the fan filter unit 90a for the unit portion 107 and the other fan filter units 90 are independently disposed. The atmosphere in the unit portion 107 are more strictly controlled than the atmosphere in the other portions. Thus, with the fan filter unit 90a, the film thickness of the resist film can be prevented from varying, contamination particles from adhering to the substrate G, and the resist film from deteriorating. Consequently, transfer marks can be effectively prevented. In addition, the number of parts of the system according to the present invention can be decreased in comparison with a system that strictly controls atmosphere thereof. Thus, since the size of the system can be reduced, the running cost thereof can be reduced. Instead of using the shutters 95 and 96, when the atmosphere in the unit portion 107 is more positively charged than the atmosphere in the other portions, since outer atmosphere does not flow to the unit portion 107, the same effect as the above-described structure can be obtained. In this case, since the number of driving portions can be decreased, contamination particles can be reduced. Thus, transfer marks can be effectively prevented.

As described above, since the drying process unit (DR) 80 dries a substrate G substantially in non-heating state, solvent in the resist solution gradually evaporates. Thus, the resist can be acceleratingly dried without affecting it. Moreover, in the later heating process, since the resist can be prevented from being rapidly dried, transfer marks can be effectively prevented from taking place on the substrate G.

In addition, since inertia gas or the like is blown to the substrate G, part of solvent such as thinner in the resist solution evaporates. Thus, after the drying process is performed, when the edge remover (ER) 23 performs the edge surface process for the substrate G, excessive resist solution can be easily removed. In addition, since the resist is dried in such a manner that it does not flow, the resist does not flow to a resist-removed portion of the substrate G.

In the drying process unit (DR) 80, inertia gas or the like may be blown to a substrate G that is stopping rather than traveling. In addition, the shower head 82 may blow inertia gas to one row rather than the entire lower surface.

Figure 8:
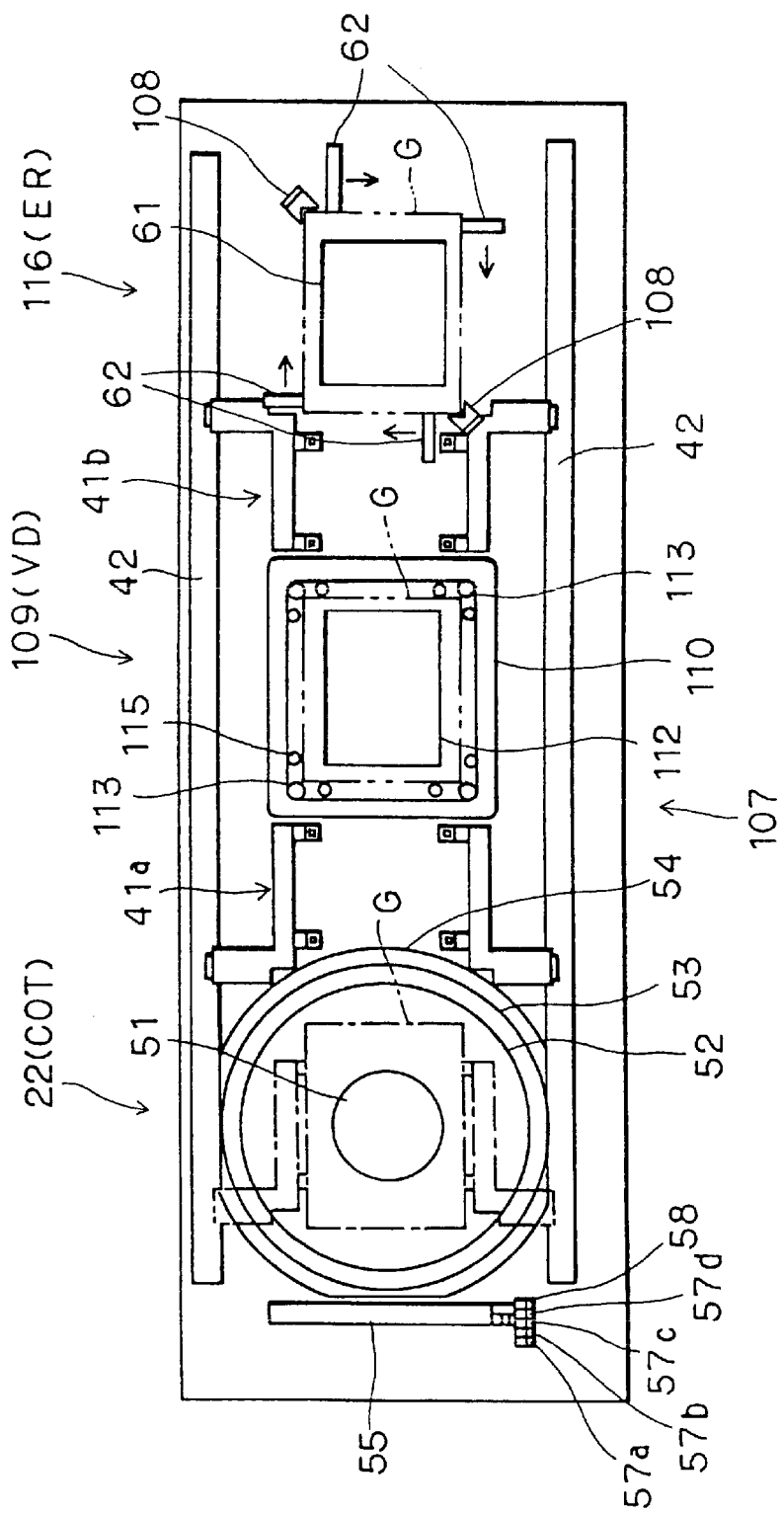
FIG. 8 is a plan view showing the overall structure of a resist coating process unit (CT), a vacuum drying process unit (VD), and an edge remover (ER) that are integrally disposed.
Figure 9:
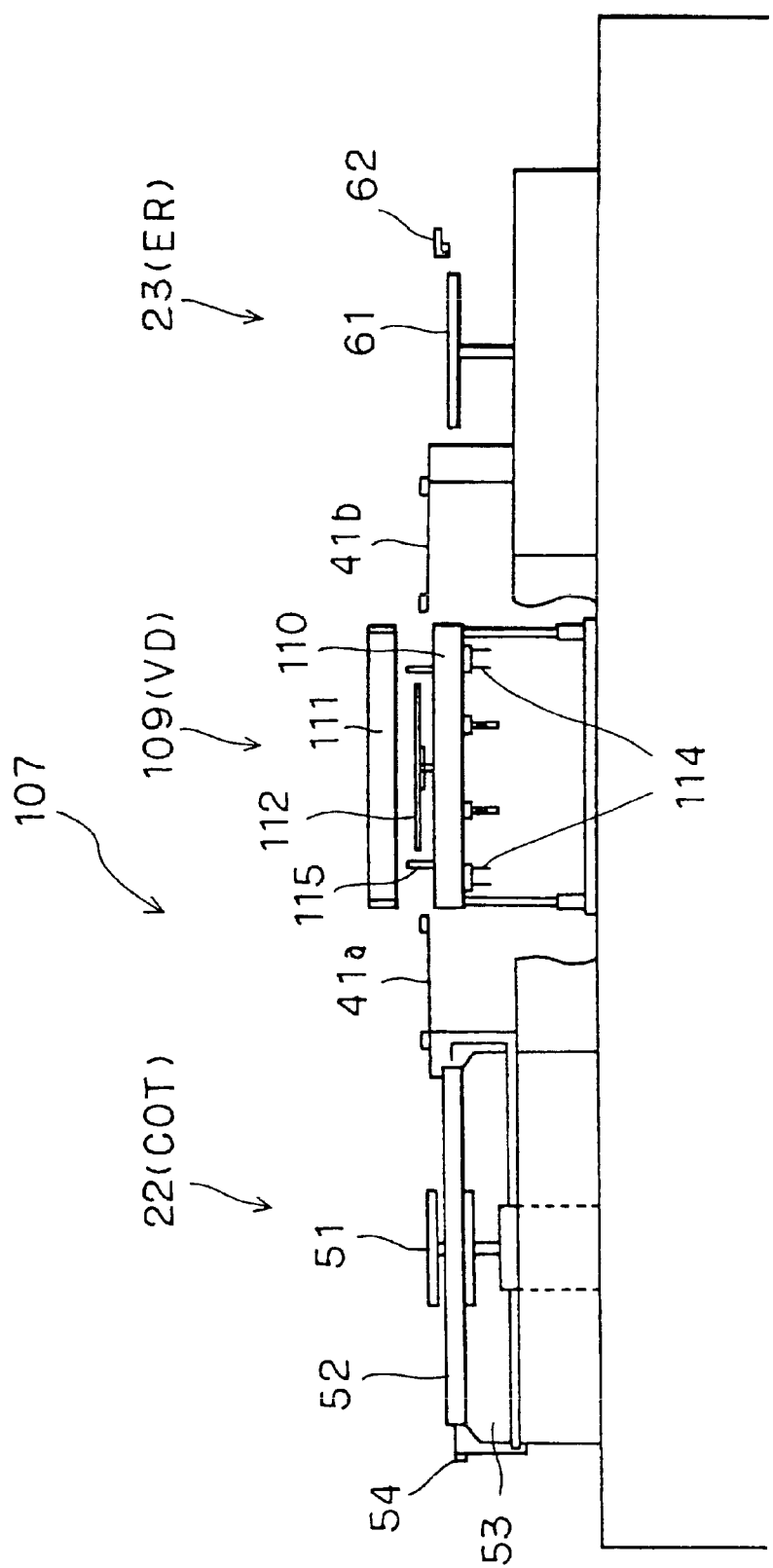
FIG. 9 is a sectional view of FIG. 8.

Instead of the drying process with inertia gas or the like shown in FIG. 6, after the first drying process, a vacuum drying process as a second drying process may be performed by a vacuum drying process unit (VD) 109 shown in FIGS. 8 and 9.

The vacuum drying process unit (VD) 109 has a lower chamber 110 and an upper chamber 111. The upper chamber 111 is disposed above the lower chamber 110. The upper chamber 111 airtightly seals the inside of the process chamber. The lower chamber 110 has a stage 112 that holds a substrate G. Four exhaust openings 113 are disposed at corner portions of the low chamber 110. The four exhaust openings 113 are connected to exhaust pipes 114 (see FIG. 9). The exhaust pipes 114 are connected to an exhaust pump (not shown) such as a turbo-molecular exhaust pump. Thus, gas in the process chamber formed between the lower chamber 110 and the upper chamber 111 is exhausted so that a predetermined vacuum degree (for example, 0.1 Torr) is obtained. The stage 112 does not have a sucking mechanism. Instead, a substrate G is simply placed on the stage 112. Transfer pins (not shown) that are protrusible are disposed on the stage 112. The transfer pins transfer a substrate G. The transfer pins contact a non-process area of the substrate so as to prevent the transfer pins from adversely affecting the processes of the substrate G.

Deviation preventing guides 115 are disposed on the lower chamber 110. When the inner pressure is reduced, the deviation preventing guides 115 prevent the substrate G from dislocating against an allowable area of the edge remover (ER) 23. When the substrate G is placed at a proper position, it does not contact the displacement preventing guides 115.

Next, the process of the vacuum drying process unit (VD) 109 will be described. The conveying arm 41 conveys a substrate G coated with resist to the vacuum drying process unit (VD) 109. Gas in the process chamber formed between the lower chamber 110 and the upper chamber 111 is exhausted until a predetermined vacuum degree (for example, 0.1 Torr) is obtained. Thus, part of solvent such as thinner in resist evaporates. The resist can be acceleratingly dried without affecting it. As will be described later, transfer marks can be prevented from taking place on the substrate G.

The pressure of the atmosphere in the second drying process is preferably lower than that in the first drying process. In the first drying process, the pressure of the atmosphere in the process chamber is reduced from the normal pressure in such a manner that small foams in the resist film do not grow. Thereafter, in the second drying process, the resist film is dried in the atmosphere whose pressure is lower than the atmosphere in the first drying process. Thus, since small forms do not grow in the resist film, the film thickness of the resist film do not vary. Consequently, transfer marks can be effectively prevented. In addition, since the first drying process and the second drying process are performed in parallel, substrates G can be effectively dried.

In addition, since the second drying process is followed by the heating and drying processes, solvent in the resist solution can be completely dried. Thus, after the developing process is performed, resist solution coated on a substrate G does not dissolve in developing solution. Consequently, the film thickness of the resist film does not decrease. As a result, transfer marks can be effectively prevented.

In this case, since the pressure of the atmosphere in the process chamber is reduced, part of solvent such as thinner in resist solution evaporates. Thus, the resist can be acceleratingly dried without affecting it. Consequently, transfer marks can be effectively prevented from taking place on the substrate G.

In the above-described embodiment, as a sealing mechanism that seals atmosphere of the unit portion, a shutter that vertically moves was used. Alternatively, a shutter that moves horizontally or rotates around a particular axis may be used. When the shutter that moves horizontally is used, it can be opened with smaller driving force than the shutter that movers vertically. When the shutter that rotates is used, atmosphere that flows from the outside of the unit portion collides with the shutter. Thus, the shutter prevents the outer atmosphere from flowing to the substrate holding portion of the unit. Consequently, the shutter can prevent particles or chemical from adhering to the substrate G. In the above-described embodiment, the shower head as a gas supplying mechanism that supplies gas to a substrate was disposed below the cover of the resist coating process unit (COT). Alternatively, the shower head may be disposed to a moving arm (not shown) so that when gas is blown, the shower head is placed above the substrate G. In this case, the volume of the rotating cup 52 can be decreased. Thus, the pressure in the rotating cup 52 can be reduced in short time. Consequently, the throughput can be improved. Alternatively, the size of the system can be decreased.

In the above-described embodiment, one conveying arm as an intra-unit conveying mechanism was disposed in the unit portion. Alternatively, as shown in FIG. 8, the conveying arm may be composed of a first conveying arm 41a and a second conveying arm 41b. The first conveying arm 41a conveys a substrate G from the resist coating process unit (COT) 22 to the drying process unit (DR) 80. The second conveying arm 41b conveys the substrate G from the drying process unit (DR) 80 to the edge remover (ER) 23. Thus, since the first conveying arm 41a and the second conveying arm 41b are separately disposed, the throughput is further improved.

Next, an edge remover (ER) as a resist removing process portion that removes resist on the periphery of a substrate G according to a second embodiment of the present invention will be described. In the second embodiment, for simplicity, similar portions to those in the first embodiment are denoted by similar reference numerals and their description is omitted.

As shown in FIG. 8, two alignment mechanisms 108 that align a substrate G are disposed at two corner portions on a holding table 61 of an edge remover (ER) 116.

Next, the process of the edge remover (ER) 116 will be described. A conveying arm 41 conveys a substrate G to the edge remover (ER) 116. The alignment mechanisms 108 align the substrate G. Four removers 62 travel along four sides of the substrate G. The four removers 62 spray thinner to the four side edges of the substrate G so as to remove excessive resist thereon. During the process of the resist coating process unit (COT) 22 or the drying process unit (DR) 80, even if the substrate G deviates, it is aligned. Thereafter, since the four removers 62 travels along the four sides of the substrate, the edge surface process can be accurately performed.

It should be noted that the present invention is not limited to the above-described embodiments. Instead, the present invention can be applied to various modifications of the above-described embodiments. In the above-described embodiments, a coating and developing process system for LCD substrates was described. However, the present invention can be applied to a coating and developing process system for color filters of LCD substrates. In addition, the present invention can be applied to a costing and developing process system for other substrates such as semiconductor wafers.

As described above, according to the present invention, just after resist solution is coated on a substrate G, it is dried substantially in a non-heating state. Thus, solvent in resist solution gradually evaporates. Consequently, the resist can be acceleratingly dried without affecting it. As a result, transfer marks can be effectively prevented from taking place on the substrate G.

As a drying process in a non-heating state, gas is blown to a substrate coated with resist solution. Alternatively, when the pressure of atmosphere of a substrate coated with resist solution is reduced, the substrate can be dried with a simple means in a non-heating state.

After the drying process is performed in the non-heating state, when resist on edge surfaces of the substrate is removed, since the resist solution is dried, excessive resist solution can be easily removed.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A substrate process method for forming a particular film on a front surface of a substrate, comprising the steps of:

(a) coating a solution on the front surface of a substrate and drying the substrate in a first atmosphere at a first reduced pressure; and (b) drying the substrate in a second atmosphere at a second reduced pressure in a non-heating state, the second reduced pressure being lower than the first reduced pressure.

2. The substrate process method as set forth in claim 1, wherein the step (b) is performed by supplying a gas to the substrate coated with the resist solution.

3. The substrate process method as set forth in claim 2, further comprising the step of:

(c) heating and drying the substrate, the step (c) being preceded by the step (b).

4. The substrate process method as set forth in claim 3, further comprising the step of:

(d) removing a resist or a particular film on an edge surface of the substrate, the step (d) being preceded by the step (a) and followed by the step (c).

5. The substrate process method as set forth in claim 4, wherein an atmosphere of the substrate conveyed after the step (a) and before the step (c) is different from an atmosphere of the substrate conveyed after the step (a) and before the step (d).

6. The substrate process method as set forth in claim 5, wherein at least one of temperature, humidity, contamination, and chemical is controlled in the atmosphere of the substrate conveyed after the step (a) and before the step (d).

7. The substrate process method as set forth in claim 5, wherein a conveying mechanism for conveying the substrate after the step (d) and before the step (c) is different from a conveying mechanism for conveying the substrate after the step (a) and before the step (d).

* * * * *